United States Patent
Tsunai et al.

(12) 
(10) Patent No.: US 6,618,088 B1
(45) Date of Patent: Sep. 9, 2003

(54) CHARGE TRANSFER DEVICE HAVING THREE PIXEL ROWS ARRANGED ADJACENTLY TO EACH OTHER

(75) Inventors: Shiro Tsunai, Tokyo (JP); Kazuo Miwada, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/245,762

(22) Filed: Feb. 8, 1999

(30) Foreign Application Priority Data

Feb. 6, 1998 (JP) .......................... 10-025829
Dec. 2, 1998 (JP) .......................... 10-342647

(51) Int. Cl.$^7$ .......................... H04N 3/14; H04N 5/335; H04N 9/09; H01L 29/747; G11C 19/28; H03K 23/46
(52) U.S. Cl. ................... 348/311; 348/316; 348/265; 257/215; 377/62; 377/63
(58) Field of Search ................. 348/311, 316, 348/319, 282, 283, 265, 272, 321–323; 257/215, 219, 221; 377/61–63

(56) References Cited

U.S. PATENT DOCUMENTS

| | | | | |
|---|---|---|---|---|
| 4,949,143 A | * | 8/1990 | Iesaka et al. | 257/220 |
| 5,751,032 A | | 5/1998 | Yu | 257/233 |
| 5,869,835 A | | 2/1999 | Udd | |
| 6,034,366 A | * | 3/2000 | Yu | 348/283 |

FOREIGN PATENT DOCUMENTS

| | | | | |
|---|---|---|---|---|
| EP | 7-46371 | | 2/1998 | |
| JP | 56-152267 | | 11/1981 | |
| JP | 61-294962 | | 12/1986 | |
| JP | 61-294962 A | * | 12/1986 | ............ H04N/1/04 |
| JP | 4-369268 | | 12/1992 | |
| JP | 04-369268 A | * | 12/1992 | ......... H01L/27/148 |
| JP | 62-76960 | | 10/1994 | |
| JP | 9-162383 | | 6/1997 | |
| JP | 9-186818 | | 7/1997 | |
| JP | 9-307816 | | 11/1997 | |
| JP | 64-90664 | | 4/1999 | |

* cited by examiner

*Primary Examiner*—Andrew Christensen
*Assistant Examiner*—Nhan Tran
(74) *Attorney, Agent, or Firm*—Foley & Lardner

(57) ABSTRACT

A charge transfer device is disclosed wherein three pixel rows are arranged adjacently to each other. First to third pixel rows are arranged adjacently to each other, and the charge transfer device includes a first charge transfer element for reading out and transferring signal charges generated in the first pixel row and a second charge transfer element for reading out and transferring signal charges generated in the second and third pixel rows. Second readout electrodes for reading out signal charges generated in the second pixel row into the second charge transfer element are provided with one electrode placed between adjacent pixels of the third pixel row.

10 Claims, 21 Drawing Sheets

CHARGE TRANSFER DEVICE HAVING THREE PIXEL ROWS ARRANGED ADJACENTLY TO EACH OTHER

BACKGROUND OF THE INVENTION

1. Field of the Invention

This invention relates to a charge transfer device, and more particularly to a charge transfer device including one-dimensional charge transfer elements for converting a color image into an electric signal.

2. Description of the Relates Art

A conventional charge transfer device which employs a one-dimensional charge transfer element having a plurality of pixels arranged in a row is described below. In order for the conventional charge transfer device to read a two-dimensional color image, reflection light from or transmission light through an original upon which white light is impinged is separated into three colors of red, blue and green, and the lights of the colors are converted into electric signals by the charge transfer elements and the electric signals are stored temporarily into a memory. As the one-dimensional charge transfer elements, or the original, are being moved, the reflection light or transmission light is then successively converted into electric signals, and the respective electric signals of red, blue and green obtained from the same places are composed by a computer to regenerate a two-dimensional color image. This method requires one one-dimensional charge transfer element for each of the three colors of red, blue and green. Further, the electric signals obtained by conversion of the lights of the three colors obtained from the same place must be composed into one signal. Therefore, as the distance (hereinafter referred to as line distance) between a pixel row of a certain one-dimensional charge transfer element and a pixel row of another one-dimensional charge transfer element increases, an increasing memory capacity is required to store color information. For example, if the line distance increases doubles, the necessary memory capacity also increases doubles. The increase in the memory capacity in turn may make of an image reading apparatus which employs the charge transfer device costly. Furthermore, if the original is fed slantwise, the larger the line distance becomes, the more resolution will deteriorate.

The line distance is thus important factor influencing picture quality and cost. Assuming that the length of a pixel in a longitudinal direction is equal to 1, the line distance is essentially an integer and will not be a decimal.

FIG. 1 is a plan view of a conventional charge transfer device which includes three one-dimensional charge transfer elements for reading a color image.

As shown in FIG. 1, the conventional charge transfer device includes one-dimensional charge transfer elements of first to third rows corresponding to the three primary colors of light, that is, red, blue and green respectively. It is to be noted that, the arrangements of the colors are different from product to product, and one-dimensional charge transfer elements of three rows are required to read a color original.

Each of the one-dimensional charge transfer elements includes a plurality of pixel elements 1 for converting optical signals into charges, an element separation area 2, CCDs (Charge Coupled Devices) 4, and a readout electrode 3 for controlling reading out of charges from pixel elements 1 into CCDs 4. Each of the CCDs 4 has transfer electrodes $19_1$, $19_2$, $11_1$, $11_2$ in this order. Readout electrode 3 is made of polysilicon in the same step as that for transfer electrodes $11_1$, $11_2$.

FIG. 2 shows a section of FIG. 1 taken along line G–G', i.e., a structure of a portion through which charge is read out from pixel element 1 to CCD 4 and a potential distribution during operation. FIG. 3 shows a section of FIG. 1 taken along line H–H', i.e., a cross section of CCD 4, and a potential distribution during operation.

In the conventional charge transfer device, each of the CCDs 4 has a two-phase driving structure. A CCD 4 consists of a N-type semiconductor substrate 5, P-type well 6, a photodiode N-type well 7 which forms pixel element 1, photodiode P-type region 8 which forms pixel element 1, transfer electrodes $19_1$, $19_2$, $11_1$ and $11_2$, N-type well 10, N-type diffusion layer region 12, and oxide film 13 formed by implanting ions of boron or the like in self alignment into transfer electrodes $19_1$, $19_2$.

Next, operation of the conventional charge transfer device will be described with reference to FIGS. 1 to 3.

Charges are generated in pixel elements 1 of FIG. 1 dependent on incident light amounts and a storage time, and are read out to CCDs 4 through the application of a voltage of 5 V to readout electrode 3. Signal charges 15 are read out into CCDs 4 under the control of readout electrode 3. The charges read out into CCDs 4 are transferred in one direction through the successive application of a voltage to transfer electrodes $19_1$, $19_2$ and transfer electrodes $11_1$, $11_2$ of CCDs 4, as shown in FIG. 3. The transferred charges are then converted into voltages by charge detectors (not shown) provided at the terminals of CCDs 4 to be successively read out. The charges generated in pixel elements 1 at the first to third rows are successively transferred by CCDs 4 disposed for the individual rows to be converted into voltages.

The conventional charge transfer device shown in FIG. 1, in order to read in a color image, an arrangement employs, wherein three one-dimensional charge transfer elements of the same structure are juxtaposed in three rows. With this arrangement, the line distance cannot be made equal to or smaller than double the length of pixel elements 1 in the longitudinal direction.

Another conventional example is shown in FIG. 4 wherein the line distance can be made equal to or smaller than double the length of pixel elements 1 in the longitudinal direction.

As shown in FIG. 4, in this charge transfer device, the one-dimensional charge transfer element of the first row is inverted in an upward and downward direction in the figures, to reduce the line distance between the first and second rows. This approach has a drawback in that, since the line distance between the first and second rows and the line distance between the second and third rows are not equal to each other, if an original is fed slantwise as mentioned above, the ratio in color displacement differs from color to color, resulting dirty image.

Yet another conventional example which intend to solve the aforementioned problem is shown in FIG. 5.

In the conventional charge transfer device shown, pixel elements 1 of the first, second and third rows are arranged side by side and all of the line distances between adjacent pixel elements 1 is made equal to the length of pixel elements 1 in the longitudinal direction. Charges generated in pixel elements 1 in the one-dimensional charge transfer element of the second row are read out into CCDs 4 through pixel elements 1 of the third row.

FIG. 6 shows a sectional view of FIG. 5 taken along line I–I' and a potential distribution. A readout electrode 3 is interposed between pixel elements 1 of the second and third rows to read out charges generated in pixel elements 1 of the second row into CCDs 4 through pixel elements 1 of the third row.

In this conventional charge transfer device, the line distance is equal to the length of pixel elements 1 in the longitudinal direction. Consequently, the required memory capacity is at the least and, even if an original is fed slantwise, a resulting image would not be dirty. However, if light to be incident on pixel elements 1 of the third row is not intercepted, when reading out charges from the one-dimensional charge transfer element of the second row, then a mixture of colors will occur in pixel elements 1 of the third row.

In short, the conventional charge transfer device is disadvantageous in that, since charges of the one-dimensional charge transfer element of the second row must be passed through the one-dimensional charge transfer element of the third row, a color mixture will occur, which results in defect in characteristic such as appearance of a mistaken color.

SUMMARY OF THE INVENTION

It is an object of the present invention to provide a charge transfer device wherein three rows of pixels can be arranged adjacently to each other without giving rise to a problem in characteristic such as color mixture or appearance of a mistaken color.

The charge transfer device according to the present invention comprises first to third pixel rows arranged adjacently to each other, a first charge coupled element for reading out and transferring signal charges generated in the first pixel row, and a second charge coupled element for reading out and transferring signal charges generated in the pixels of the second and third pixel rows. In addition, second readout electrodes for reading out signal charges generated in the second pixel row to the second charge transfer element are provided, each of which is placed between adjacent pixels of the third pixel row.

Accordingly, since the line distances between each of the adjacent first to third pixel rows can be made substantially equal to a pixel length without giving rise to problems in characteristics such as color mixture or appearance of a mistaken color, a required memory capacity can be reduced.

According to an embodiment of the present invention, the pitch between the electrodes of the second charge coupled element is equal to one half the pitch between the electrodes of the first charge coupled element, and further includes electrodes provided between the first readout electrodes and the third readout electrodes for temporarily storing signal charges therein.

Accordingly, signal charges generated in the second pixel train and signal charges generated in the third pixel train can be read out simultaneously.

According to another embodiment of the present invention, the readout channel of each second readout electrode is dimensioned such that the width thereof is greater at the portion adjacent to the second charge coupled element than at the portion adjacent to the second pixel row.

In this embodiment, since the potential in the proximity of the second charge coupled element is higher than that in the proximity of the pixel elements due to narrow channel effect, the readout time of signal charges from the pixels of the second pixel row to the second charge coupled element can be reduced.

According to another embodiment of the present invention, a potential difference is produced by ion implantation below a transfer gate to thereby improve the flowing rate of charge. Accordingly, possible deterioration of the residual image characteristic can be prevented which may be caused by a long time required to read out charge and a large amount of charge remaining in the channel portion (remaining image).

The above and other objects, features and advantages of the present invention will become apparent from the following description with reference to the accompanying drawings which illustrate examples of the present invention.

DETAILED DESCRIPTION OF THE PREFERRED EMBODIMENTS

First Embodiment

Figure 5:
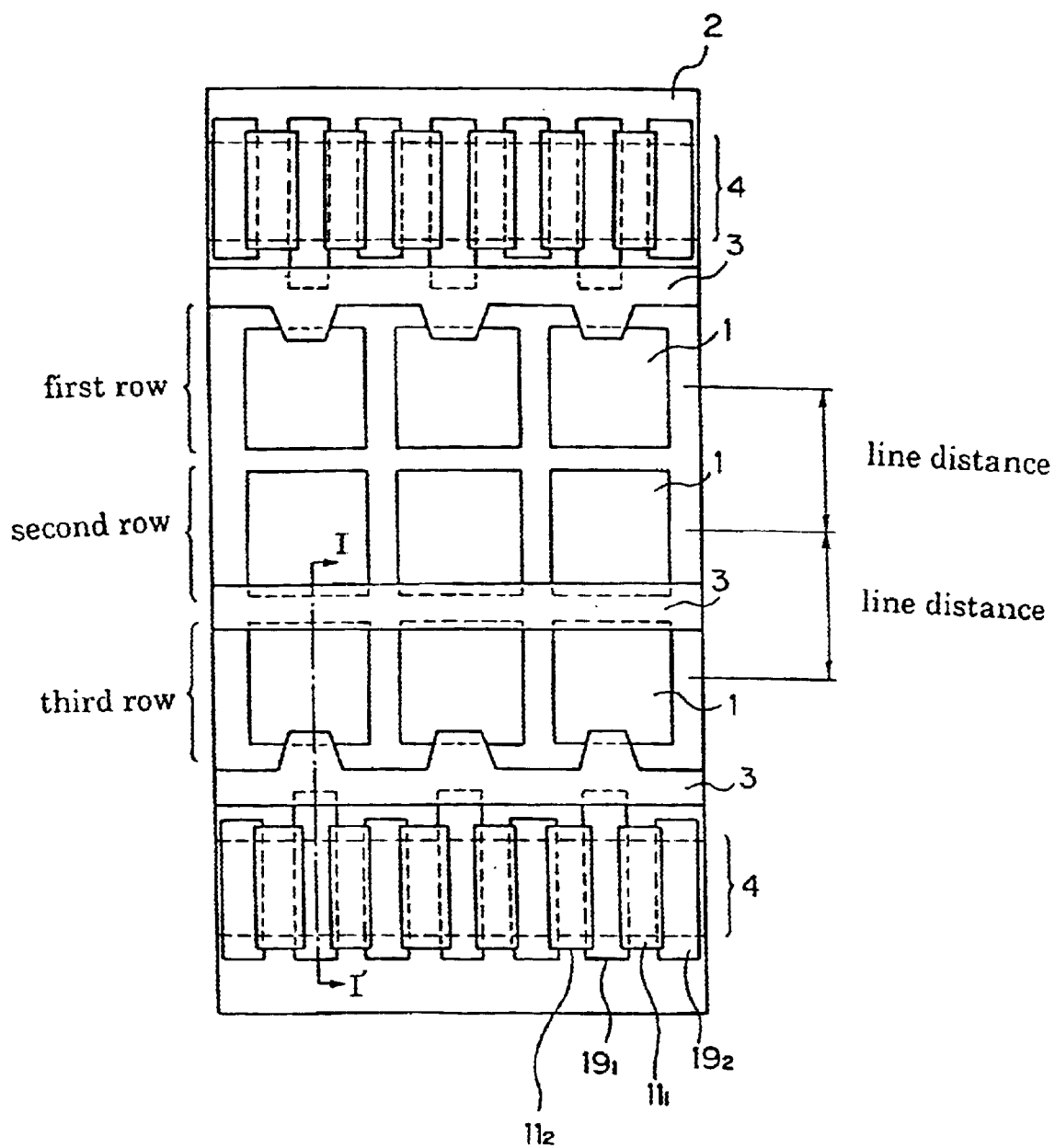
FIG. 5 is a plan view of a charge transfer device of a third conventional example.
Figure 6:
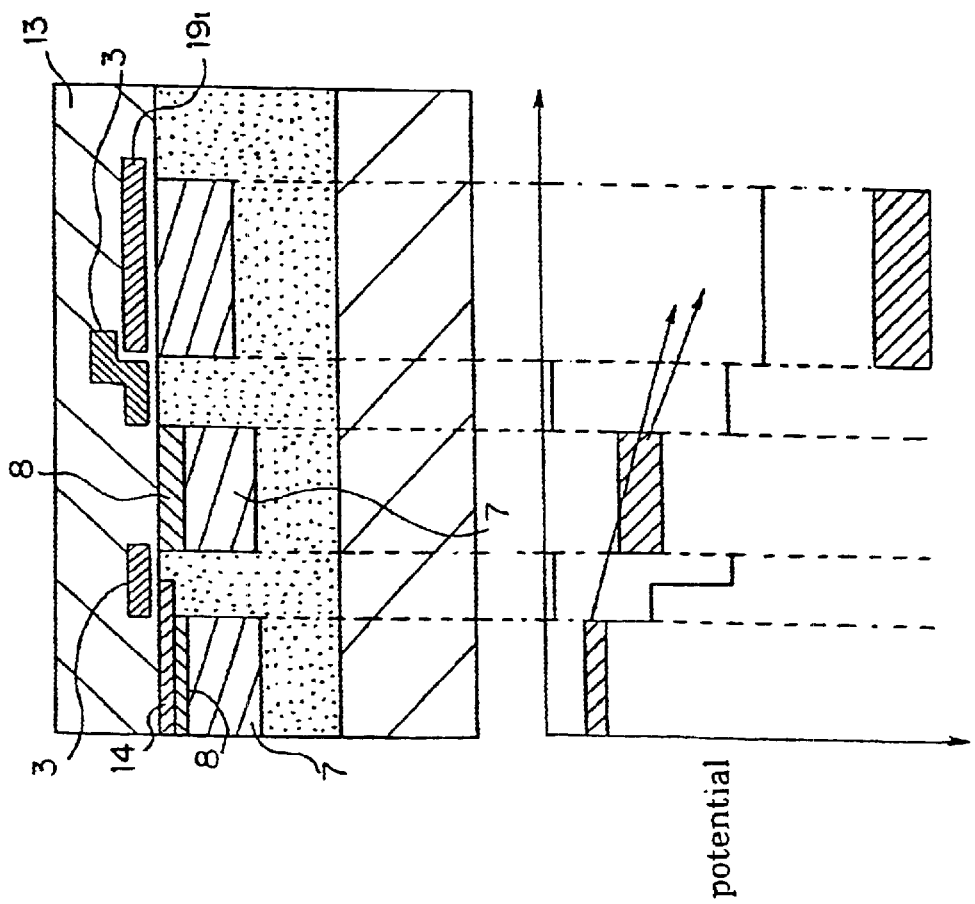
FIG. 6 is a sectional view taken along line I–I' of the charge transfer device of FIG. 5 and a potential distribution diagram.
Figure 7:
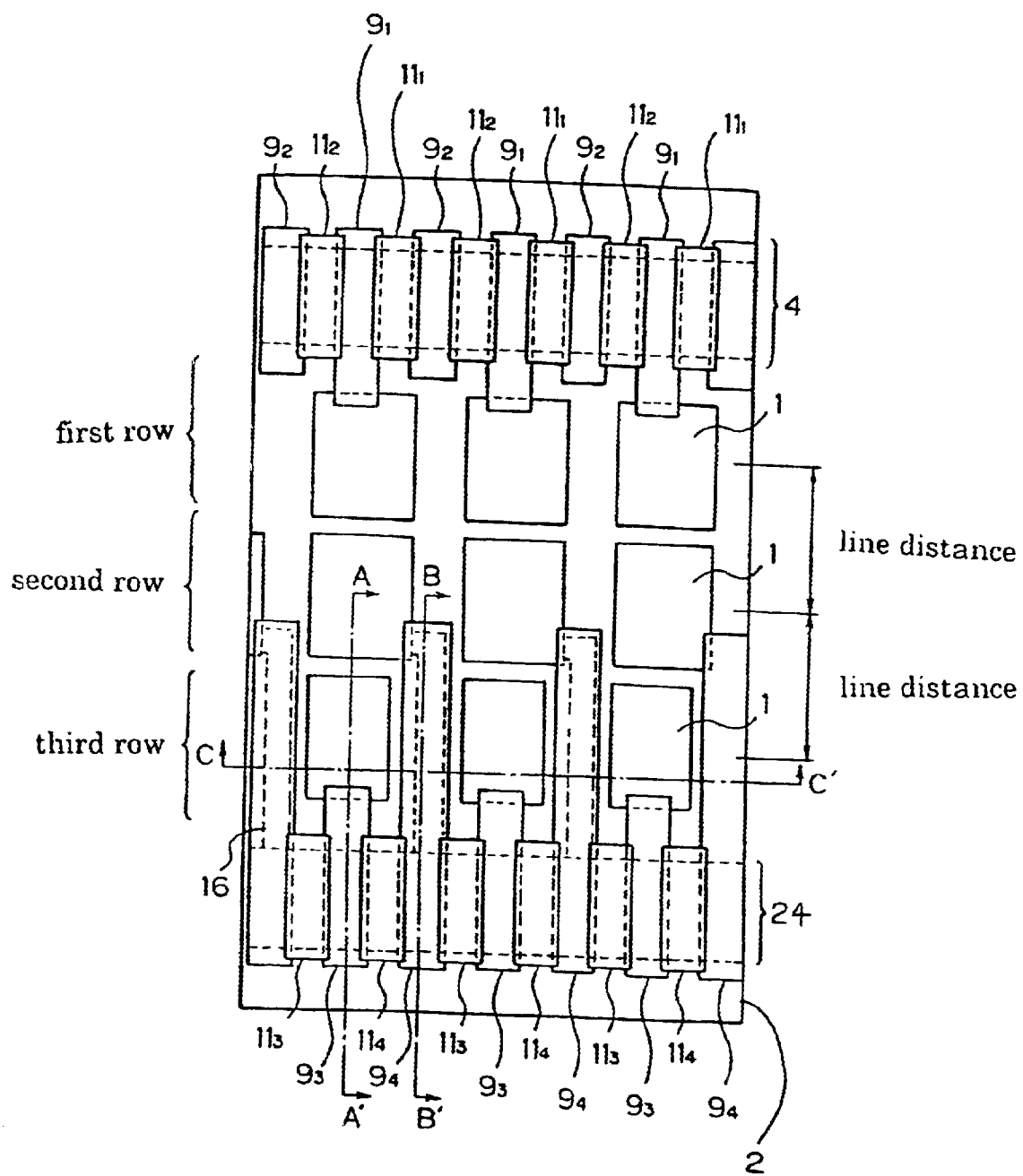
FIG. 7 is a plan view of a charge transfer device according to a first embodiment of the present invention.
Figure 8:
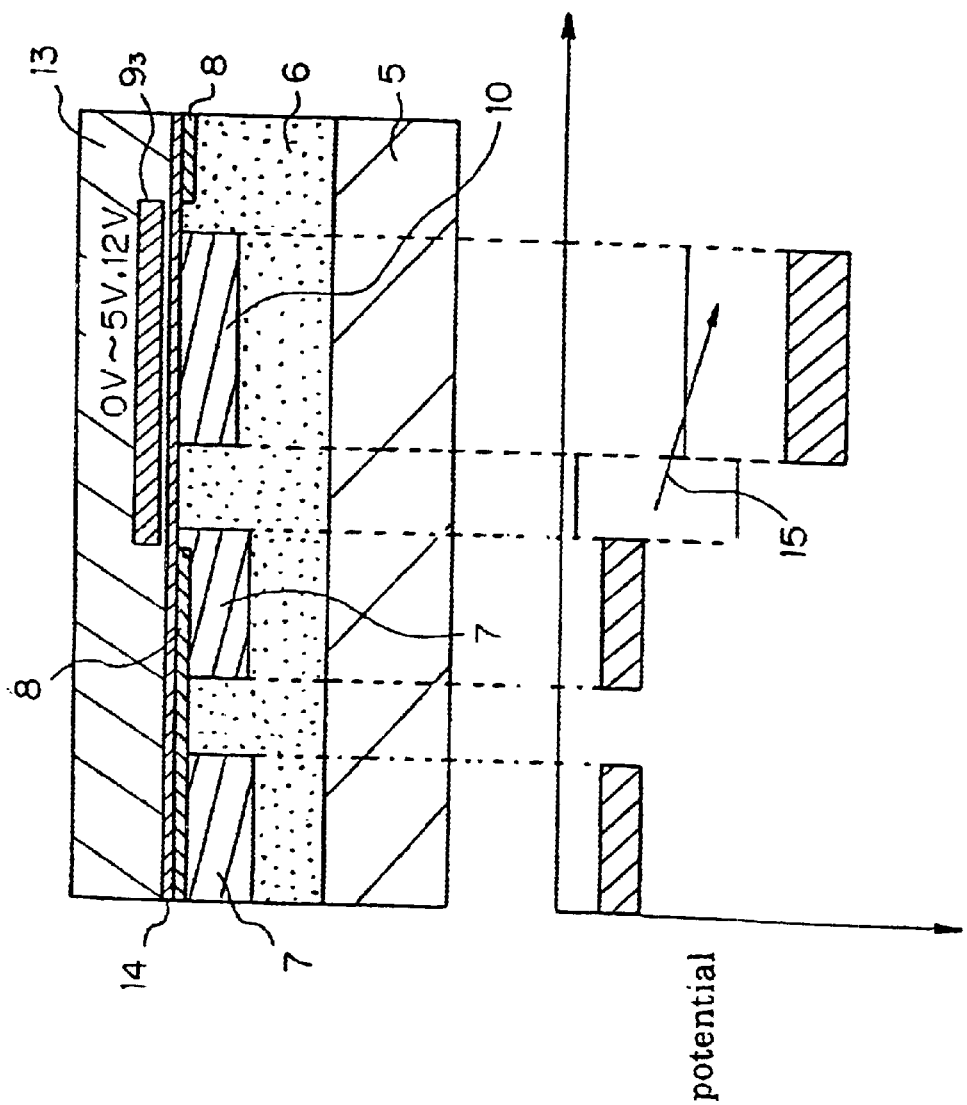
FIG. 8 is a sectional view taken along line A–A' of the charge transfer device of FIG. 7 and a potential distribution diagram.
Figure 9:
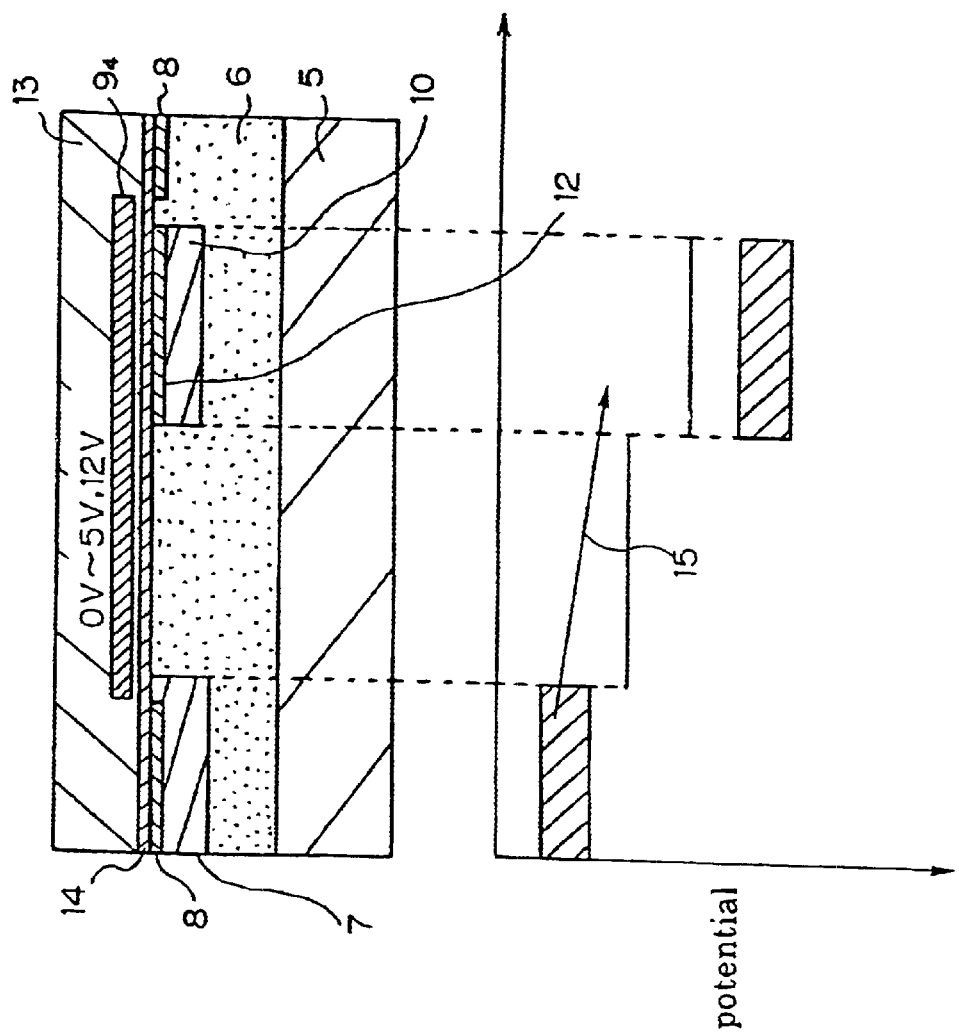
FIG. 9 is a sectional view taken along line B–B' of the charge transfer device of FIG. 7 and a potential distribution diagram.
Figure 10:
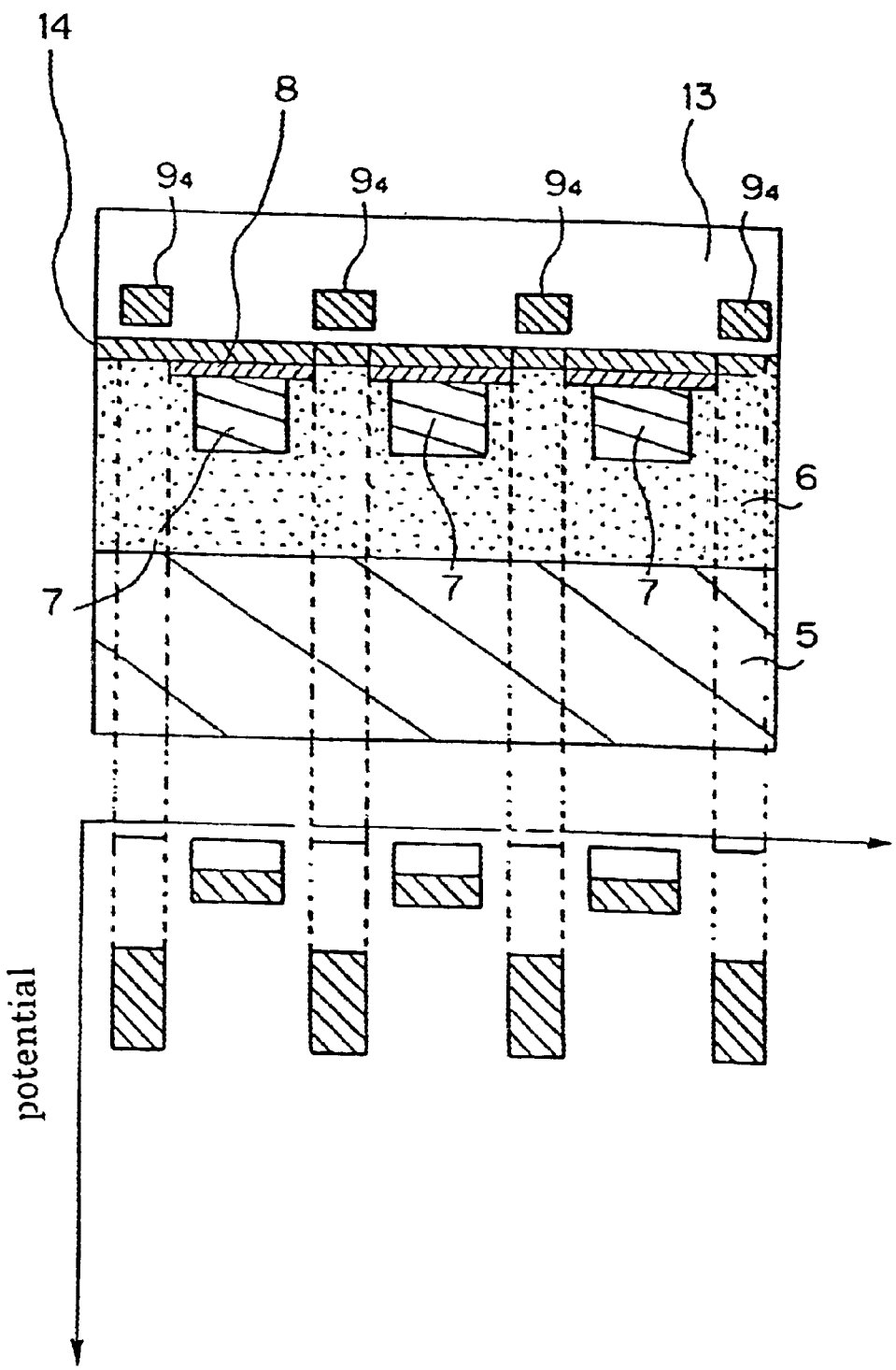
FIG. 10 is a sectional view taken along line C–C' of the charge transfer device of FIG. 7 and a potential distribution diagram.

As showing in FIG. 7, in the charge transfer device according to the present embodiment, the first, second and third rows of pixel elements 1 are arranged adjacently to each other in this order in a manner similar to the conventional charge transfer device shown in FIG. 5.

Readout electrodes $9_4$ are provided one between the adjacent pixel elements 1 of the third row, for reading out charges obtained by pixel elements 1 of the one-dimensional charge transfer element of the second row. Readout electrodes $9_3$ are intended to read out charges obtained by pixel elements 1 of the one-dimensional charge transfer element of the third row. Readout electrodes $9_3$, $9_4$ and transfer electrodes $11_3$, $11_4$ constitute each of the CCDs 24.

Next, operation of the charge transfer device according to the present embodiment will be described with reference to FIGS. 7 through 10.

Charges generated in pixel elements 1 when light which varies in accordance with different degrees of brightness or darkness of an original to be read are accumulated for a fixed period of time in individual pixel elements 1. The amount of the accumulated charge varies depending upon the amount of incident light. The charges accumulated in pixel elements 1 are transferred to CCDs 4, 24 by setting the voltages applied to readout electrodes $9_1$, $9_3$, $9_4$ formed of polysilicon in an overlapping relationship with pixel elements 1 to approximately 12 V. The charge transfer at CCDs 4 may be performed by either the two-phase driving method or the four-phase driving method.

The two-phase driving method refers to an ordinary method wherein 5 V is applied to read electrodes $9_1$, transferred electrodes 11, 0 V is applied to readout electrodes $9_2$, transfer electrodes $11_2$ at a timing, and at a next timing, 0 V is applied to readout electrodes $9_1$, transfer electrodes $11_1$ and 5 V is applied to readout electrodes $9_2$, transfer electrodes $11_2$. The four-phase driving method refers to a method wherein the four electrodes of readout electrodes $9_1$, $9_2$ and transfer electrodes $11_1$, $11_2$ are used separately from one another.

With regard to CCDs 24 provided at the one-dimensional charge transfer element of the third row side, 0 V and 5 V are also applied alternately to readout electrodes $9_3$, transfer electrodes $11_3$ and readout electrodes $9_4$, and transfer electrodes $11_4$ to perform charge transfer.

Since the voltages to readout electrodes $9_1$, $9_3$, $9_4$ vary between 0 V and 5 V, when charge is transferred measures must be taken to prevent charges from flowing pixel elements 1 to CCDs 4, 24 during charge transfer. To this end, boron is implanted in readout channels 16 below readout electrodes $9_1$, $9_3$, $9_4$ to provide P-type ion implantation region 14 to control the readout voltage for signal charges. The amount of boron to be implanted for controlling the readout voltage to 12 V and the acceleration voltage during implantation are set approximately to $2.0 \times 10^{12}/m^3$ and 60 KeV, respectively.

An explanation will be made as to how to select and read out charges accumulated in pixel elements 1 of the first, second and third rows. When reading out signal charges of pixel elements 1 of the first row, the voltage of 12 V is applied to readout electrodes $9_1$, whereupon the signal charges are read out into CCDs 4. When reading out signal charges of pixel elements 1 of the second row, a voltage of 12 V may be applied to readout electrodes $9_4$. Further, when reading out signal charges of pixel elements 1 of the third row, a voltage of 12 V may be applied to readout electrodes $9_3$. While CCDs 4 correspond one by one to pixel elements 1 of the first row, only one CCD 24 is provided for the pixels of the second and third rows and is commonly used by the second and third rows. Therefore, signal charges accumulated in pixel elements 1 of the second and third rows must be read out alternately.

In FIG. 7, pixel elements 1 of the third row have a surface area smaller than that of pixel elements 1 of the first and second rows. An, oxide film 13 for intercepting incident light is formed on the surfaces of these pixel elements 1, and portions at which oxide film 13 is not formed serve as portions at which light is actually irradiated. Consequently, the portions at which oxide film 13 is not formed are formed in the same manner for pixel elements 1 of the first to third rows so that the areas at which light is irradiated are equal in all rows.

Second Embodiment

Figure 1:
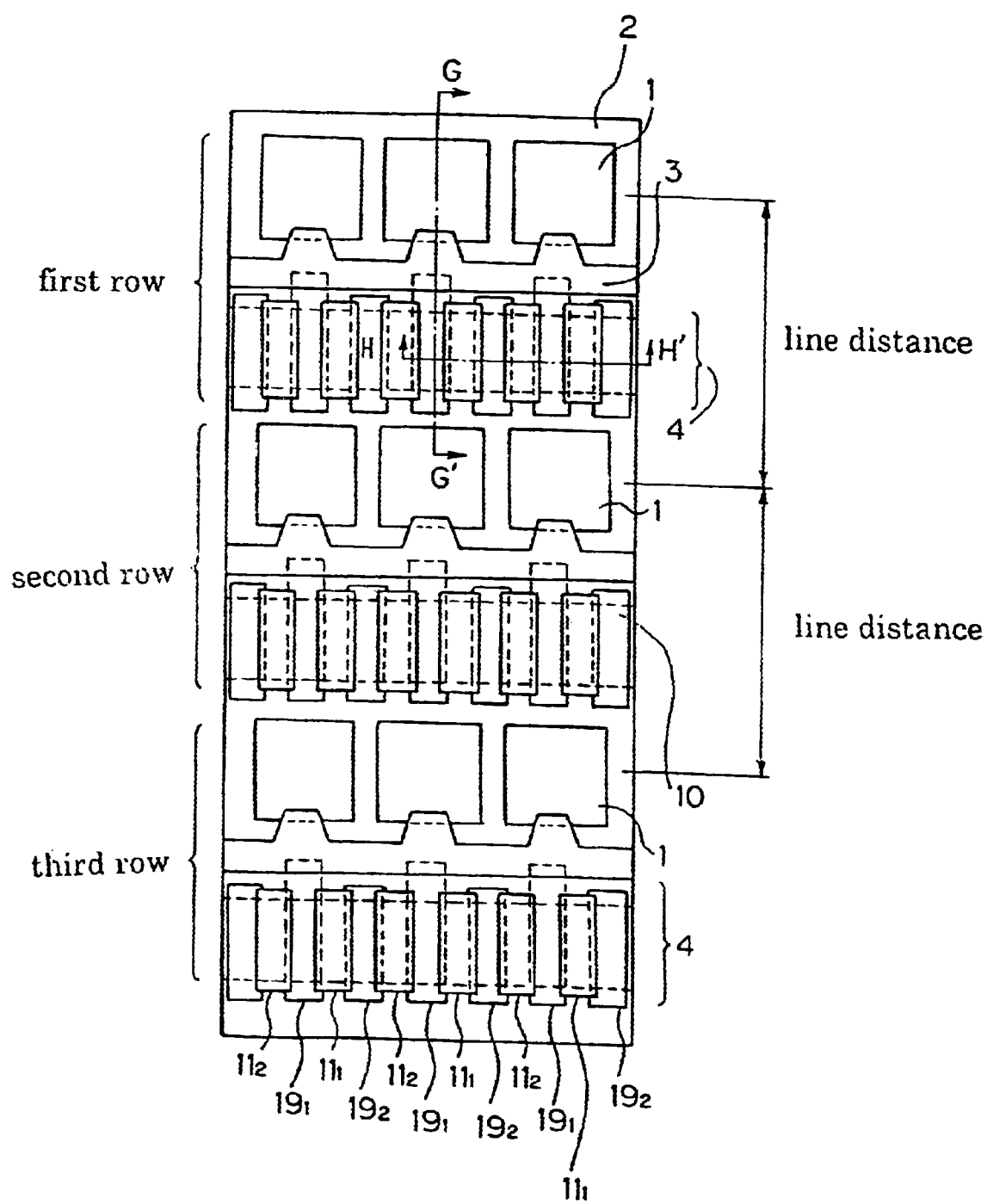
FIG. 1 is a plan view of a charge transfer device of a first conventional example.
Figure 2:
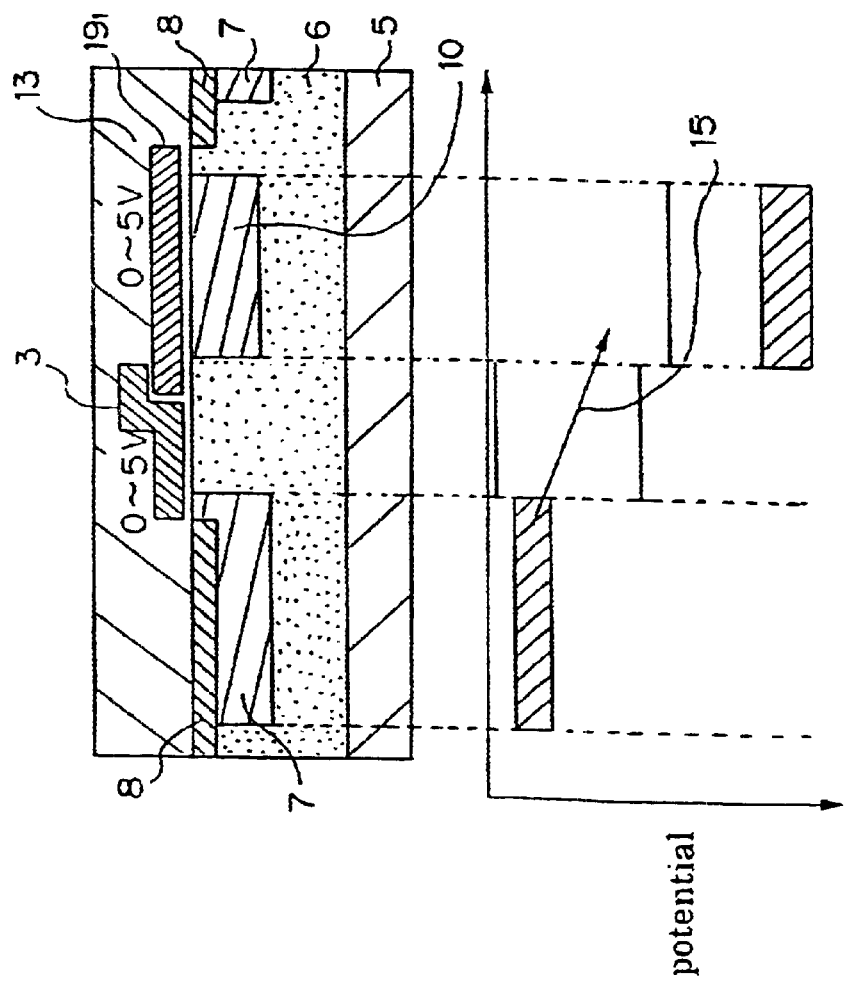
FIG. 2 is a sectional view taken along line G–G' of the charge transfer device of FIG. 1.
Figure 3:
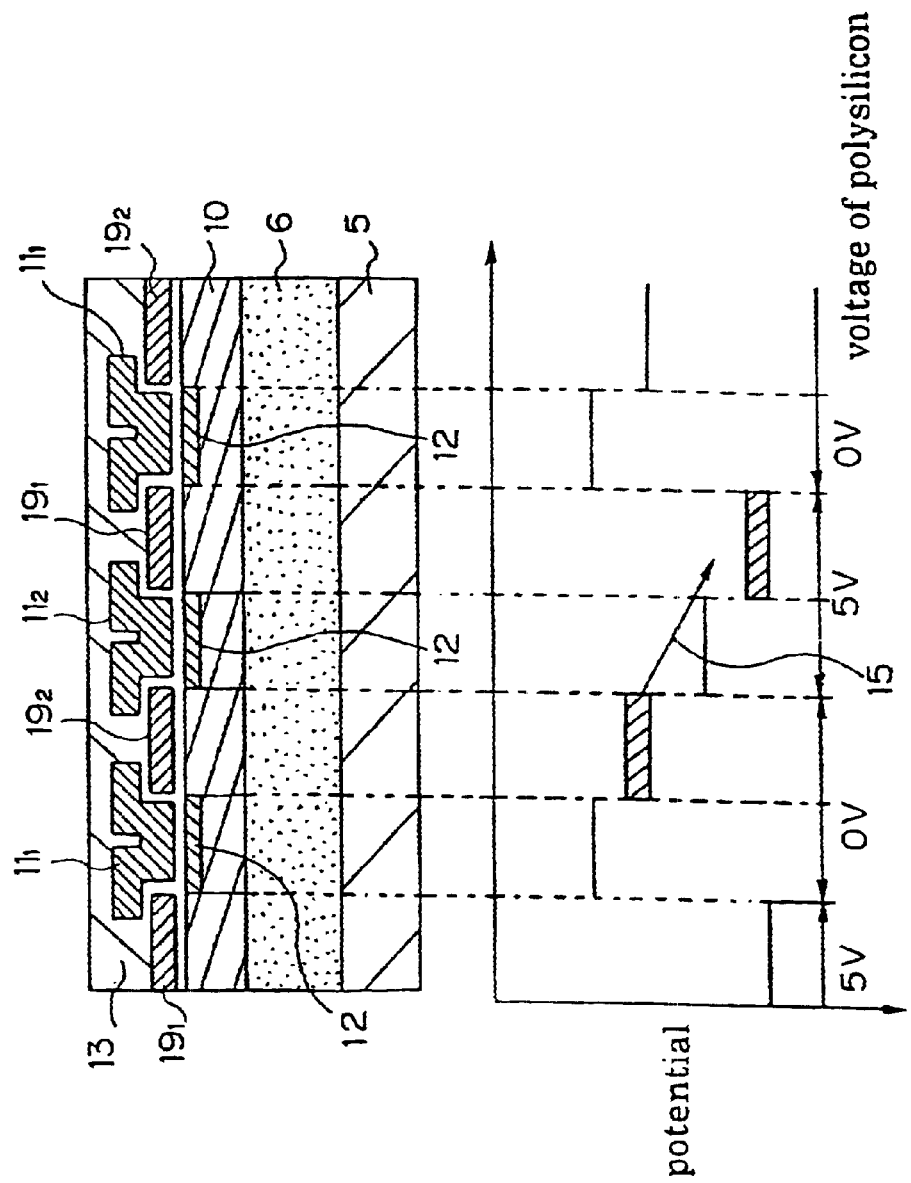
FIG. 3 is a sectional view taken along line H–H' of the charge transfer device of FIG. 1.
Figure 4:
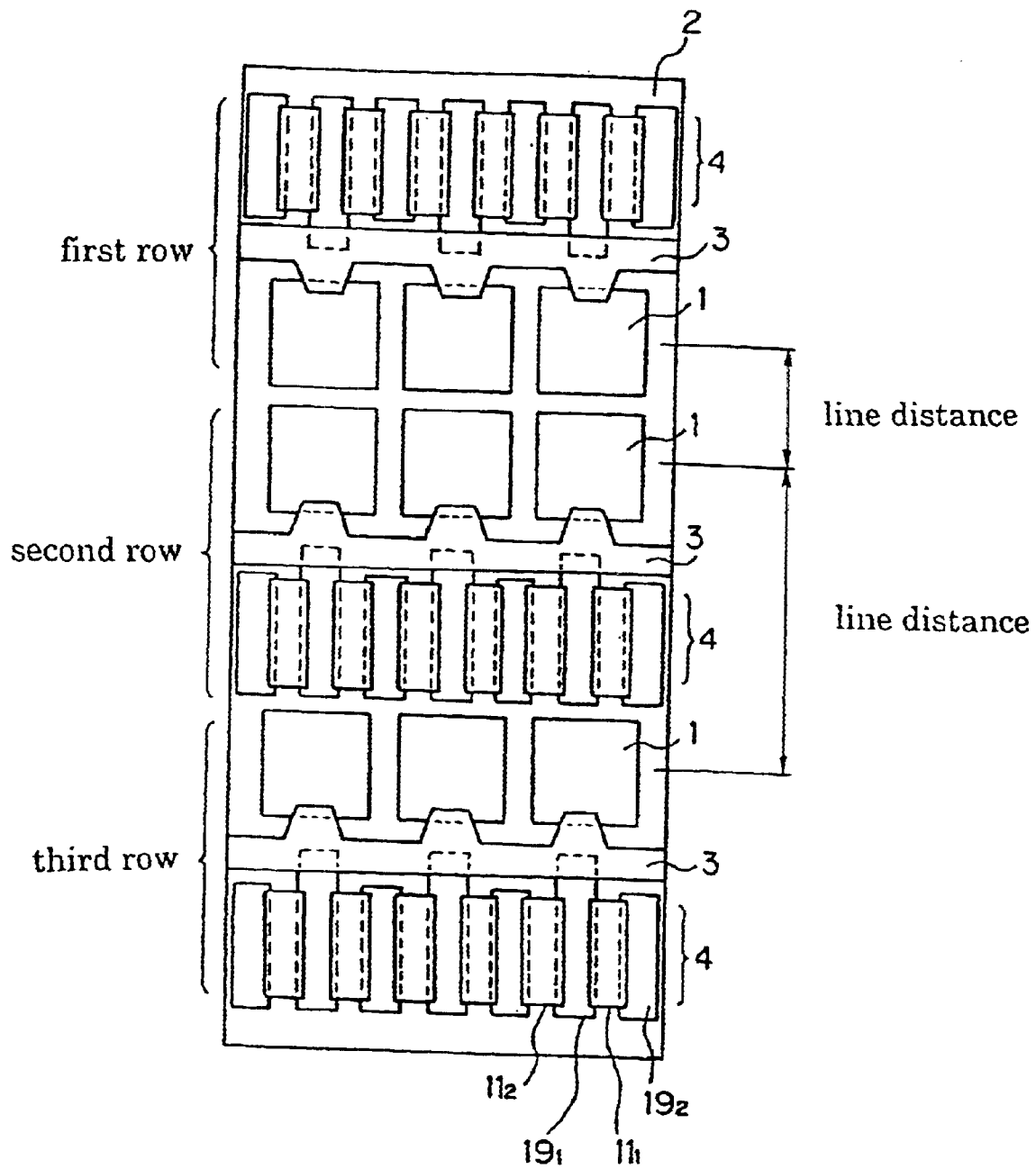
FIG. 4 is a plan view of a charge transfer device of a second conventional example.
Figure 11:
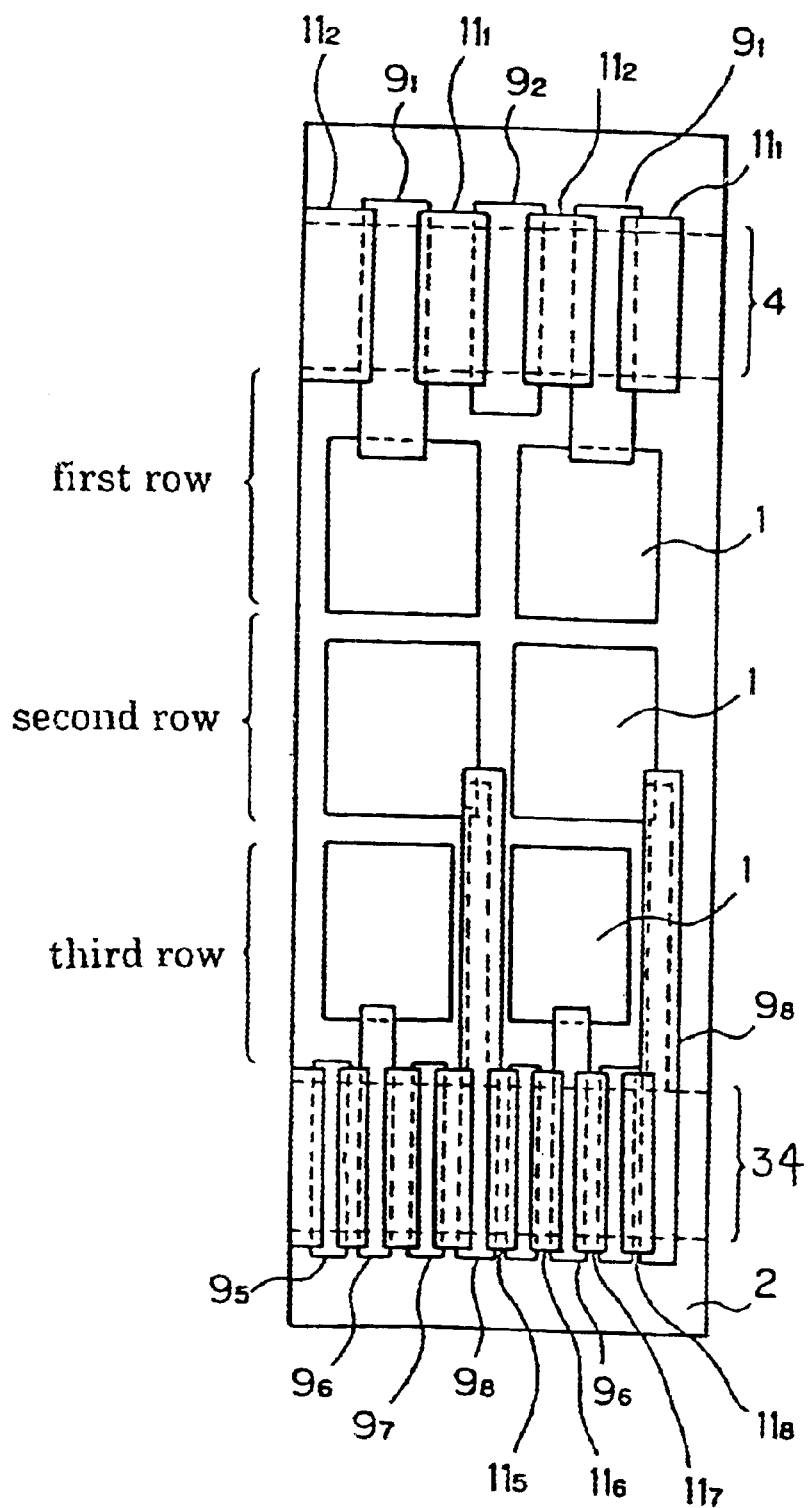
FIG. 11 is a plan view of a charge transfer device according to a second embodiment of the present invention.

FIG. 11 is a plan view of a charge transfer device according to a second embodiment of the present invention. Components shown in FIG. 1 which are identical to those shown in FIG. 7. are denoted by identical reference symbols and will not be described in detail.

The present embodiment differs from the charge transfer device of the first embodiment shown in FIG. 7 in that the pitch of CCDs 34 provided on pixel elements 1 side of the third row is twice the pitch of CCDs 4 of the first row side. In addition, each CCD 34 has readout electrodes $9_5$, $9_6$, $9_7$, $9_8$ and transfer electrodes $11_5$, $11_6$, $11_7$, $11_8$. Readout electrode $9_6$ is intended to read out signal charges accumulated in pixel elements 1 of the third row, and readout electrode $9_8$ is intended to read out signal charges accumulated in pixel elements 1 of the second row.

In the present embodiment, since it includes readout electrodes $9_5$, $9_7$ which can temporarily accumulate signal charges in addition to readout electrodes $9_6$, $9_8$ for reading out signal charges, signal charges accumulated in pixel elements 1 of the second and third rows can be read out simultaneously. If the charge transfer device of the present embodiment is formed with the present technique, the size of pixel elements 1 will be approximately 10 $\mu$m×10 $\mu$m. In the present embodiment, the pixel pitch which is the distance between adjacent pixel elements 1 arranged in the same row is greater than that in the first embodiment.

Third Embodiment

Figure 12:
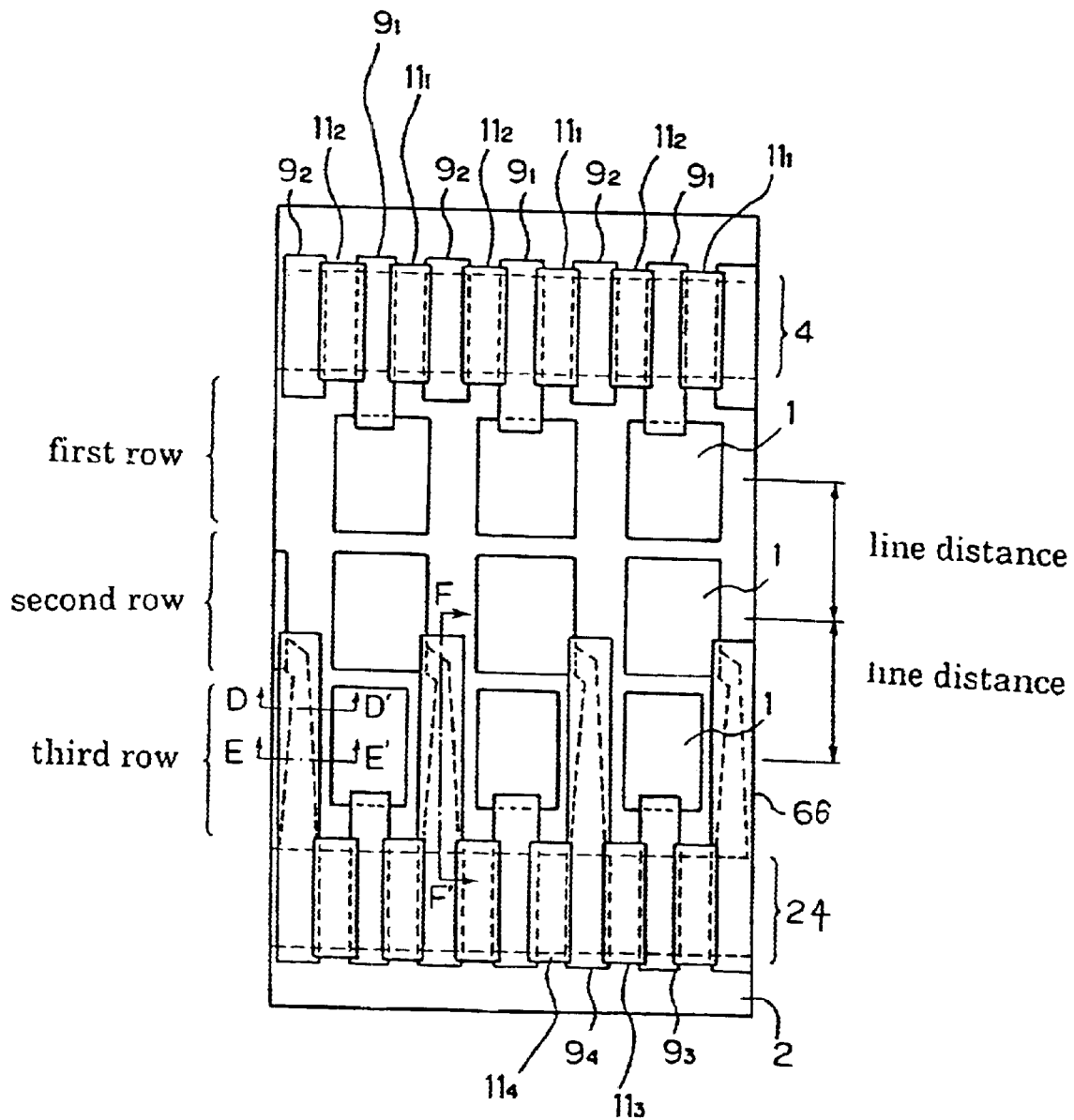
FIG. 12 is a plan view of a charge transfer device of a third embodiment of the present invention.

Referring now to FIG. 12, the charge transfer device according to the third embodiment of the present invention is a modification to and differs from the charge transfer device according to the first embodiment of FIG. 7 in that it includes, in place of readout channels 16, readout channels 66 each of which has a width greater adjacent CCD 24 than thereof adjacent pixel element 1. In FIG. 12, identical reference symbols denote corresponding components in FIGS. 7 to 10.

In the first embodiment described above, since each readout channel 16 is elongated so that it may pass between pixel elements 1 of the third row, in order to read out a signal charge accumulated in each pixel element 1 of the second row, a longer time is required than that required to read out a signal charge accumulated in each of pixel elements 1 of the first and third rows.

In contrast, in the present embodiment, since each pixel element 1 of the second row is configured such that channel width 66 of the readout channel thereof is greater adjacent CCD 24 than adjacent pixel element 1, the potential in the proximity of CCD 24 becomes higher than that in the proximity of pixel element 1 due to a narrow channel effect, and a signal charge can be read out smoothly.

Figure 13:
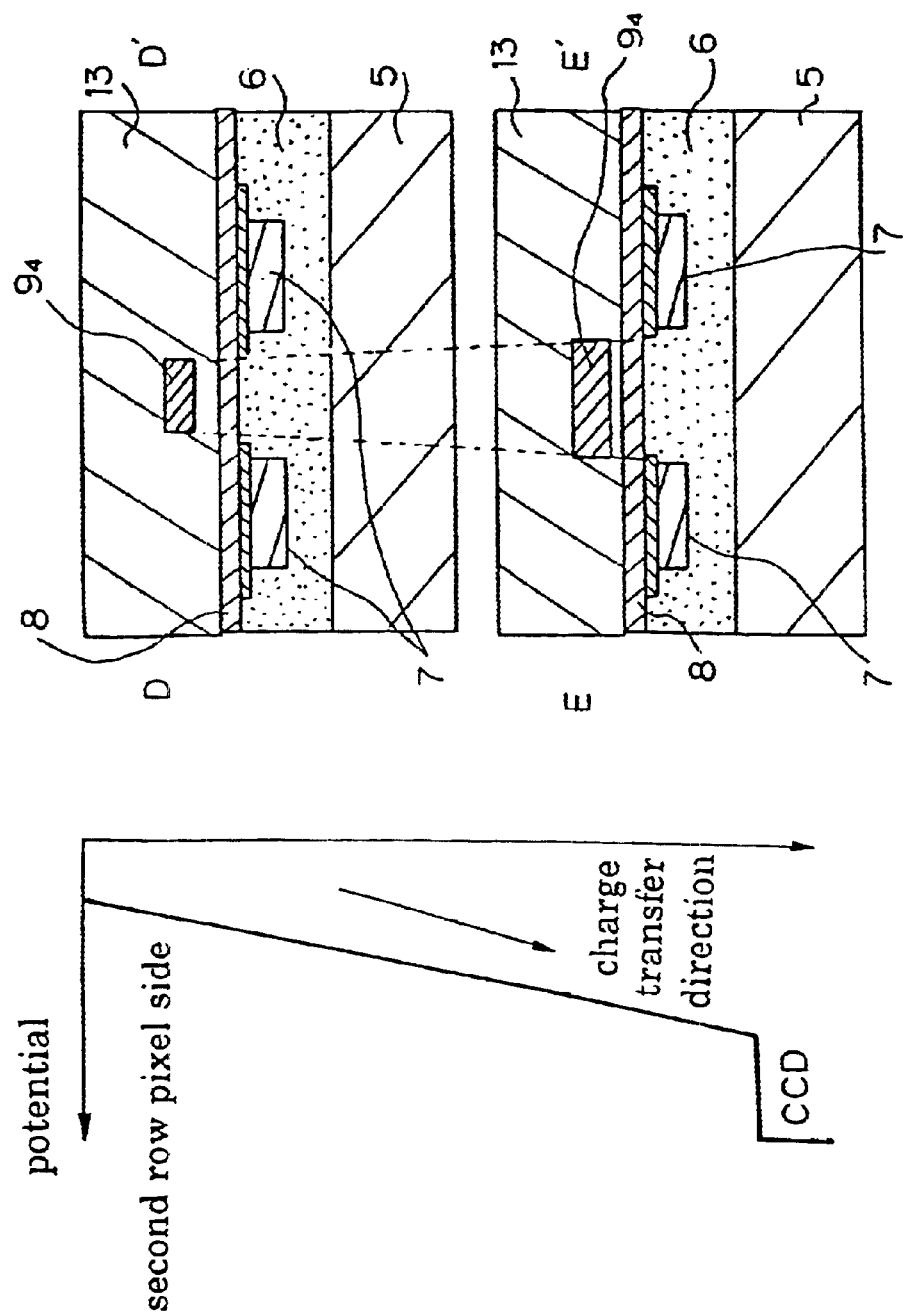
FIG. 13 is sectional views taken along line D–D' and E–E' and a potential distribution diagram along line F–F' of the charge transfer device of FIG. 12.

Referring to FIG. 13, there is shown a sectional view taken along line D–D', another sectional view taken along line E–E' and a potential distribution diagram along line F–F' of the charge transfer device of the present embodiment.

In the charge transfer device of the present embodiment, the readout time from pixel element 1 to CCD 24 is approximately 2 $\mu$ seconds.

Fourth Embodiment

A fourth embodiment is described below.

In a color linear CCD sensor of the one line distance type, pixels of the three primary colors are disposed adjacent each other. Where the line distance is 1, each of the outer side pixels is disposed adjacent a charge transfer element (CCD) while the central pixel is disposed in a spaced relationship from a CCD register.

In order to read out charge generated in the outer side pixels, a voltage higher than that used for transfer (for example, 0 to 5 V for transfer, and 12 V for reading out) is applied to the readout electrodes to read out charge from the pixels to the CCDs.

The central pixel is not disposed adjacent the CCD register. Therefore, a channel is provided between the central pixel and an outer side pixel so that charge may be read out from the central pixel to the CCD through the channel. The voltage to be used for the readout is normally equal to that used to read out charge from the two outer side pixels. Since the outer side pixels are disposed adjacent the CCD registers, the distances over which charge flows upon readout from the outer side pixels are shorter than that over which charge flows when it is read out from the central pixel, and consequently, also the readout time is shorter.

On the other hand, since the distance over which charge is transferred from the central pixel is longer and besides the width of the channel therefor is small, charge is reluctant to flow from the central pixel and a longer readout time is required. In order to solve this problem, the following countermeasures are taken.

First, an ion implantation step which is used to make a CCD sensor of the one line distance type is utilized to perform ion implantation such that the potential upon transfer of charge from the central pixel to a CCD disposed on the outer side may have a stepwise variation or distribution.

Second, the ion implantation is performed such that ions may be distributed wider on the CCD side so that the potential may become successively higher toward the CCD in the entire readout channel.

The fourth embodiment employs a method (hereinafter referred to as 2 poly-storage) wherein charge is accumulated at a polysilicon gate portion of a second layer at a CCD portion, and uses N-type ion implantation for charge accumulation, an N-type well and readout control P-type ion implantation which are used for a CCD.

The N-type ion implantation for charge accumulation is used to selectively perform, in order to make a CCD, implantation of N-type ions with polysilicon of a first layer used as a mask so that a second layer polysilicon part of the CCD is used as a charge accumulation portion and the first layer polysilicon part is used as a barrier upon transfer.

Consequently, the fourth embodiment provides a structure which includes, in order from the central pixel side, a readout control P-type implantation region, a region in which no ion is implanted (P-type well), an N-type implantation region for a CCD charge accumulation portion and an N-type well, and in which the potential successively becomes deeper from the pixel toward the CCD. Normally, in a charge transfer device, since electrons are transferred as charge, electrons smoothly flow from the pixel to the CCD.

Figure 14:
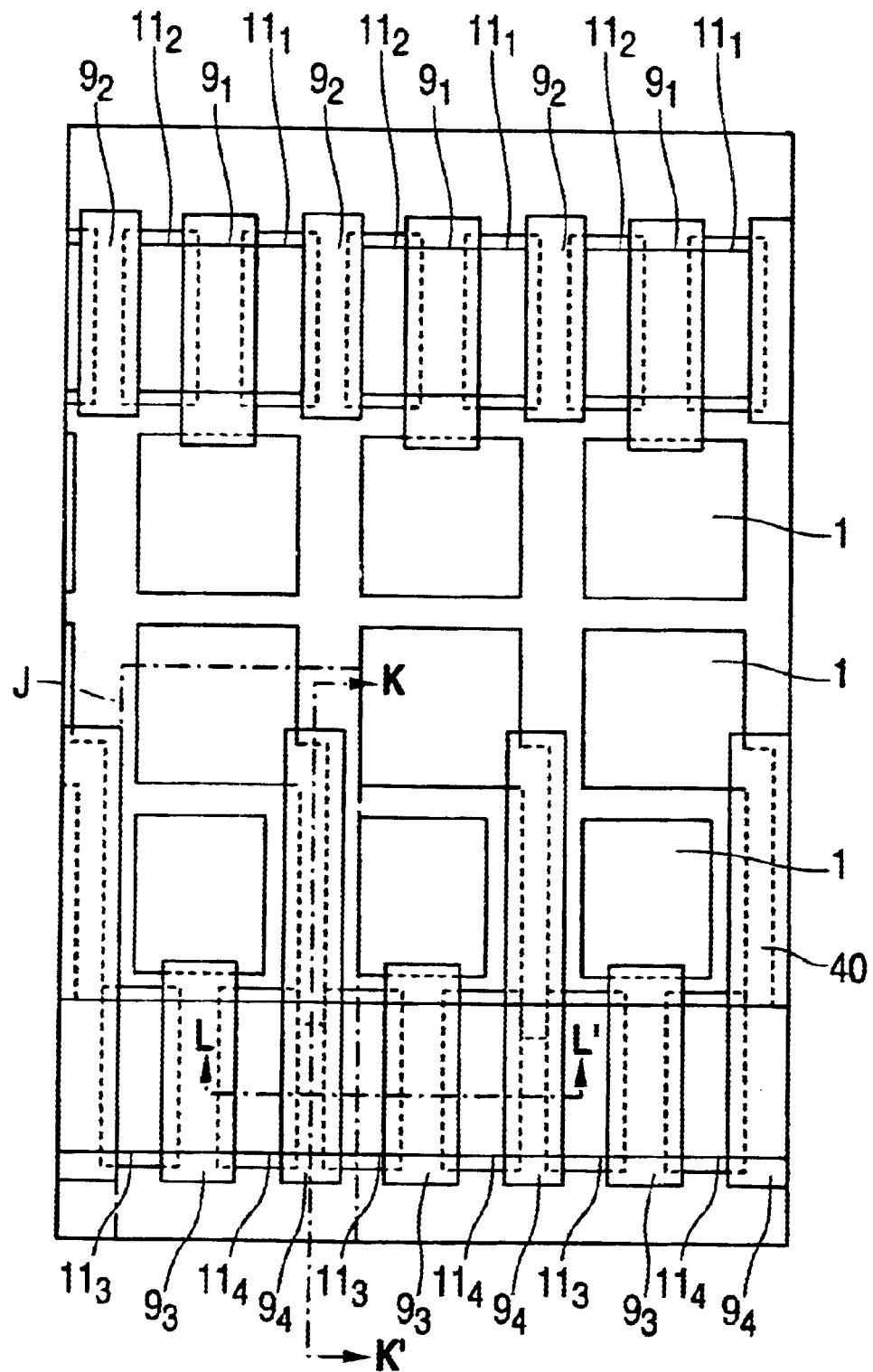
FIG. 14 is a plan view of a charge transfer device of a fourth embodiment of the present invention.
Figure 15:
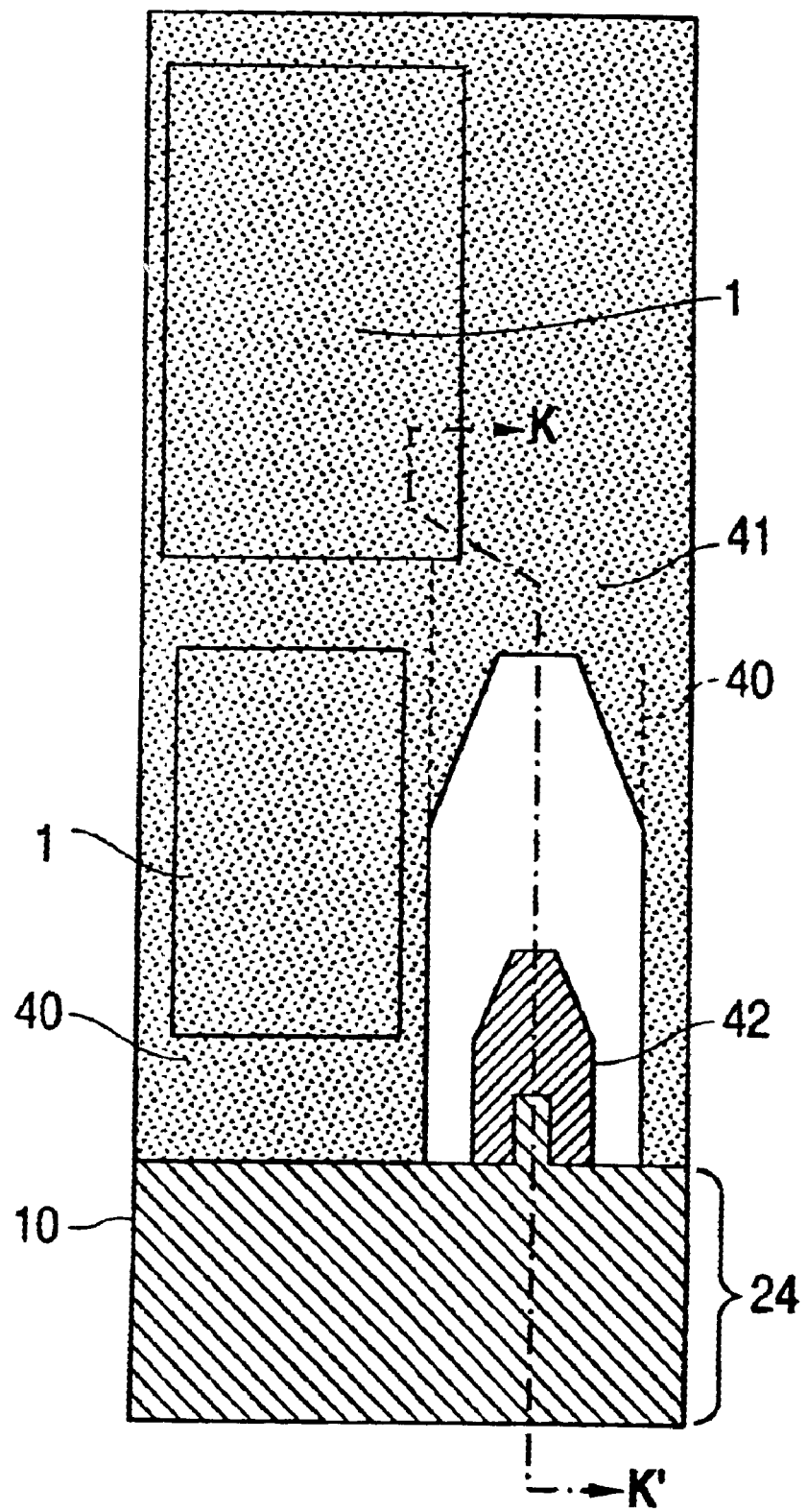
FIG. 15 is an enlarged view of a substrate at portion J of FIG. 14.
Figure 16:
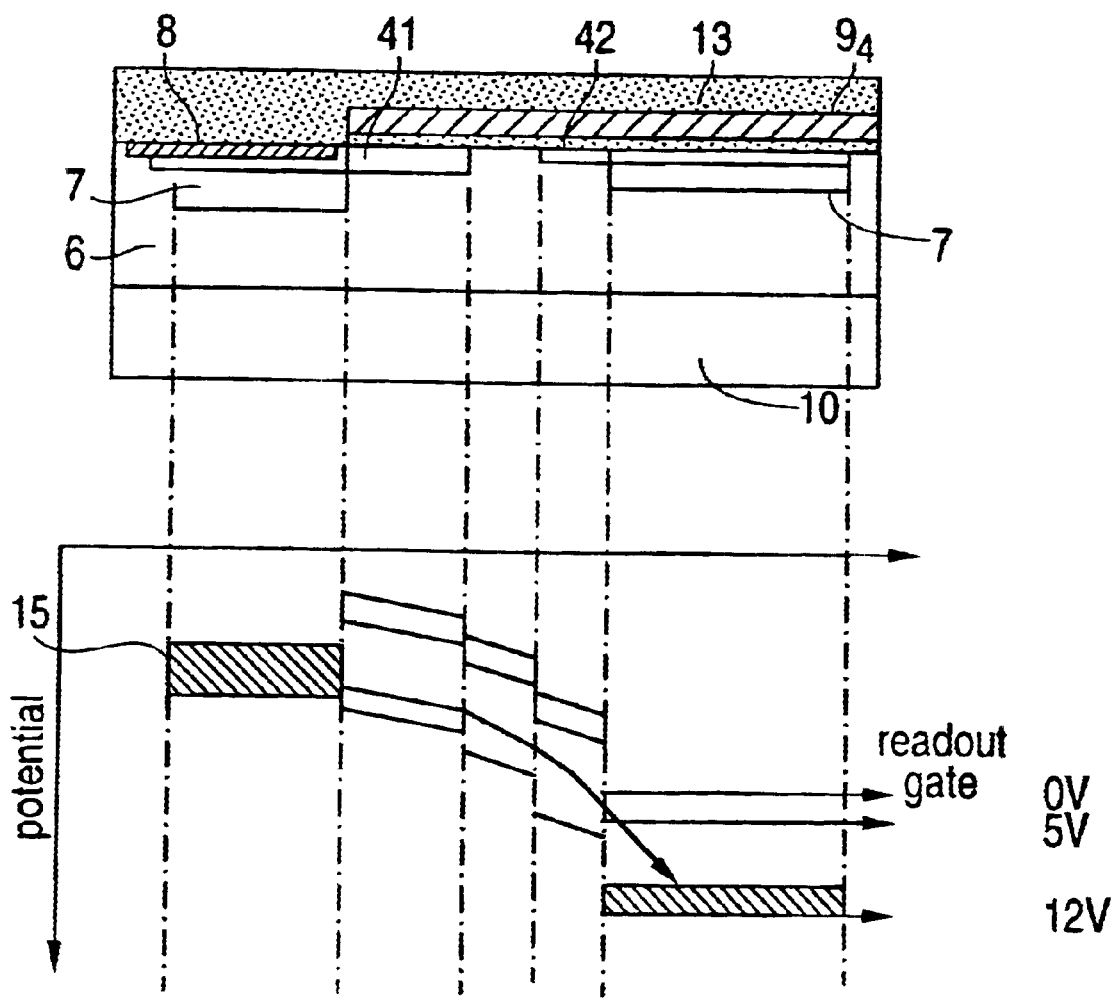
FIG. 16 is a sectional view taken along line K–K' of the charge transfer device of FIG. 15 and a potential distribution diagram.
Figure 17:
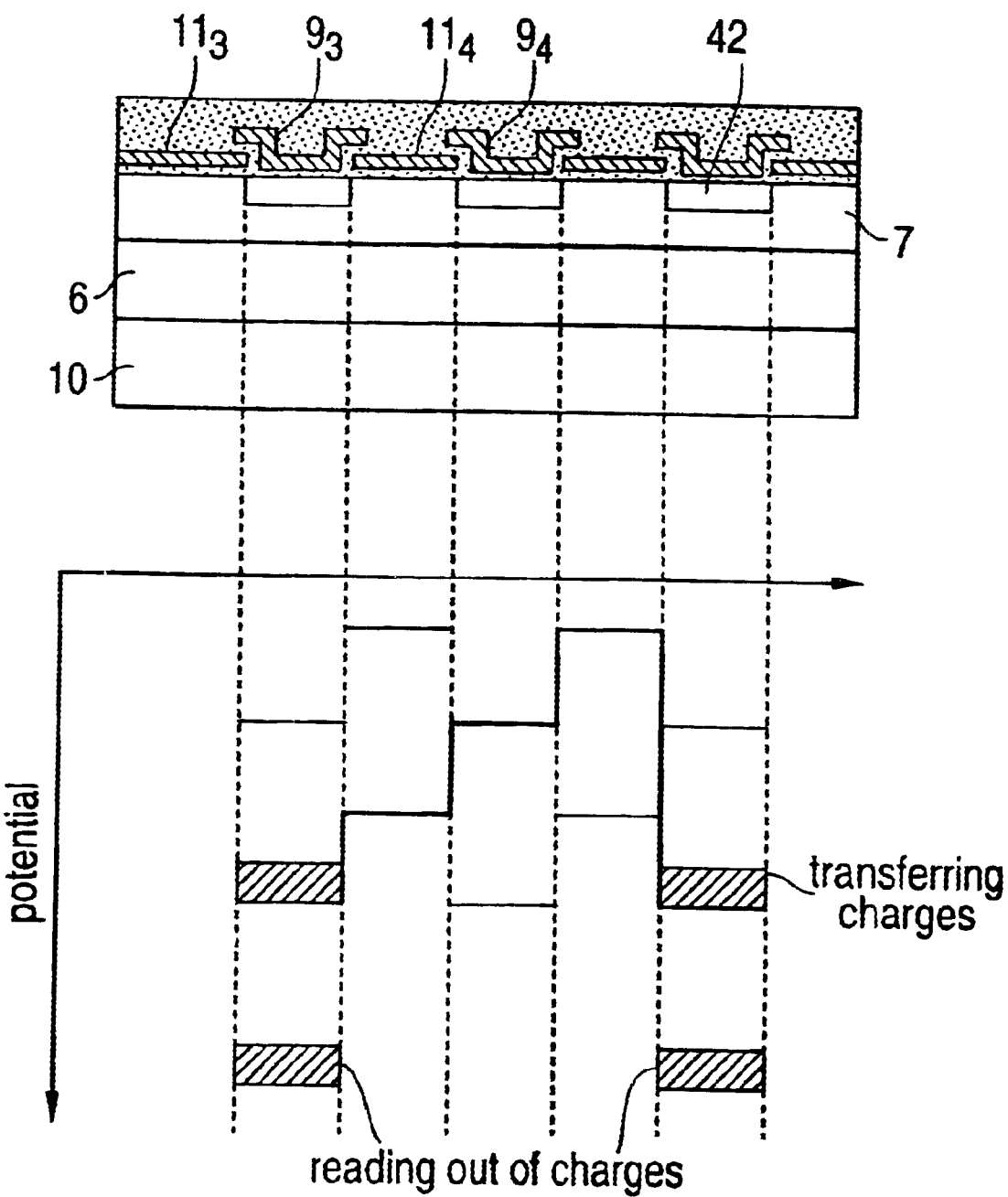
FIG. 17 is a sectional view taken along line L–L' of the charge transfer device of FIG. 14 and a potential distribution diagram.

FIG. 14 is a plan view of a charge transfer device according to a fourth embodiment of the present invention; FIG. 15 is an enlarged view of a substrate at portion J in FIG. 14; FIG. 16 is a sectional view taken along line K–K' of FIG. 15 and a potential distribution diagram; and FIG. 17 is a sectional view taken along line L–L' of FIG. 14 and a potential distribution diagram.

As shown in FIGS. 14 and 15, in a one line distance charge transfer device according to the present embodiment, the width of readout channel 40 which has a greater width on pixel 1 side and has a smaller width on CCD 24 side may be uniform.

Ion implantation is performed in order for N-type well 10, readout channel control P-type implantation region 41 and CCD charge accumulation portion N-type implantation region 42. The ion concentration of readout channel control P-type implantation region 41 must be set so that, when a voltage of 5 V is applied to the readout gate, the readout gate may be off, but when another voltage of 12 V is applied, the readout gate may be on. Into CCD charge accumulation portion N-type implantation region 42, ions are implanted such an amount that CCD charge accumulation portion N-type implantation region 42 exhibits a voltage of approximately 6 V when the depletion voltage at the N well implantation region of CCD 24 is approximately 3.5 V.

FIG. 16 shows potentials upon operations of the one line distance charge transfer device of the present embodiment when 0 V, 5 V and 12 V are applied to the readout gate. Four stages of potential are present between pixel 1 and CCD 24, and the potential difference between them acts effectively upon electrons to allow high rate readout from pixel 1 to CCD 24. FIG. 17 shows a sectional structure of the CCD part of the 2 poly-storage and a potential distribution.

The charge transfer device having the construction described above operates in a similar manner to the charge transfer device of the third embodiment described hereinabove.

In this manner, while the third embodiment improves the readout rate of signal charge generated in the second pixel train by forming readout channel 40 such that it has a greater width on CCD 24 side, the present embodiment produces a potential difference by ion implantation below the transfer gate to improve the flowing rate of charge. Accordingly, the potential difference reduces remaining charge, and an improved residual image characteristic can be achieved.

According to a result of an experiment, where no potential difference is involved, a readout time of 10 microseconds is required, but according to the present embodiment, charge can be read out in a time of approximately 1 microsecond. Further, in regard to the residual image characteristic by remaining charge, while a conventional device exhibits a readout remaining amount of charge of approximately 5%, the present embodiment exhibits an improvement of the readout remaining amount of charge approximately to 1%.

Fifth Embodiment

Figure 18:
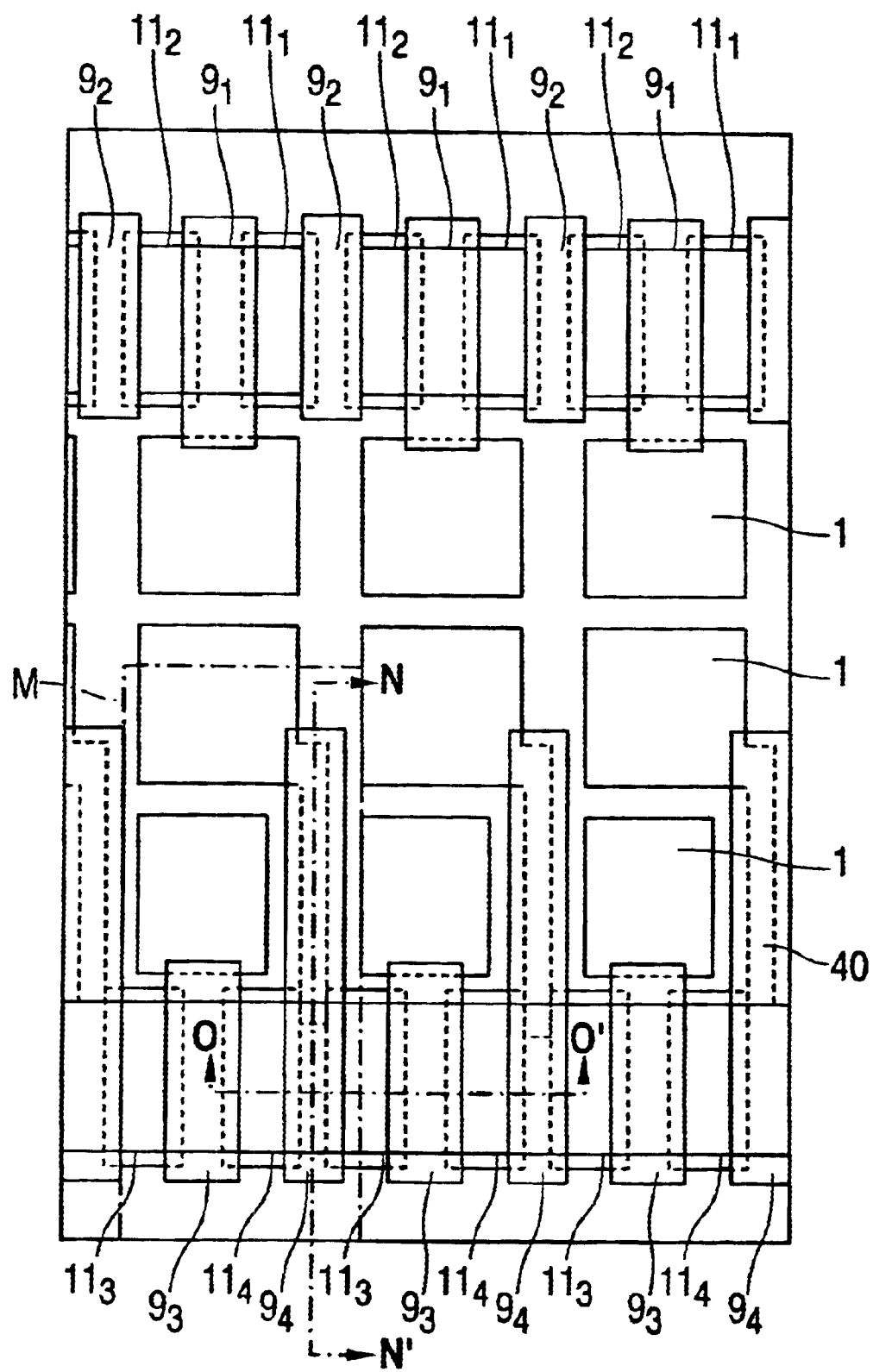
FIG. 18 is a plan view of a charge transfer device of a fifth embodiment of the present invention.
Figure 19:
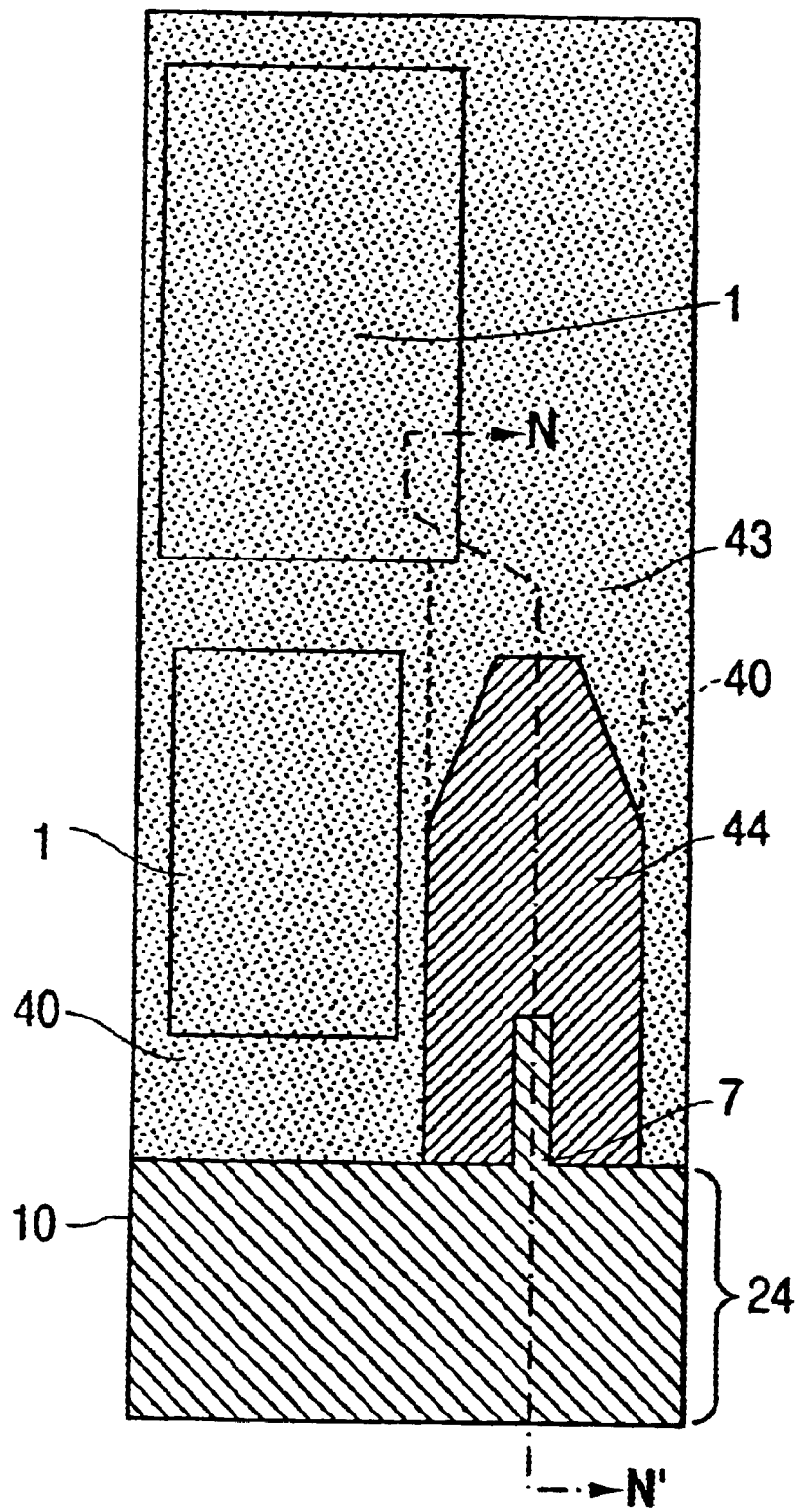
FIG. 19 is an enlarged view of a substrate at portion M of FIG. 18.
Figure 20:
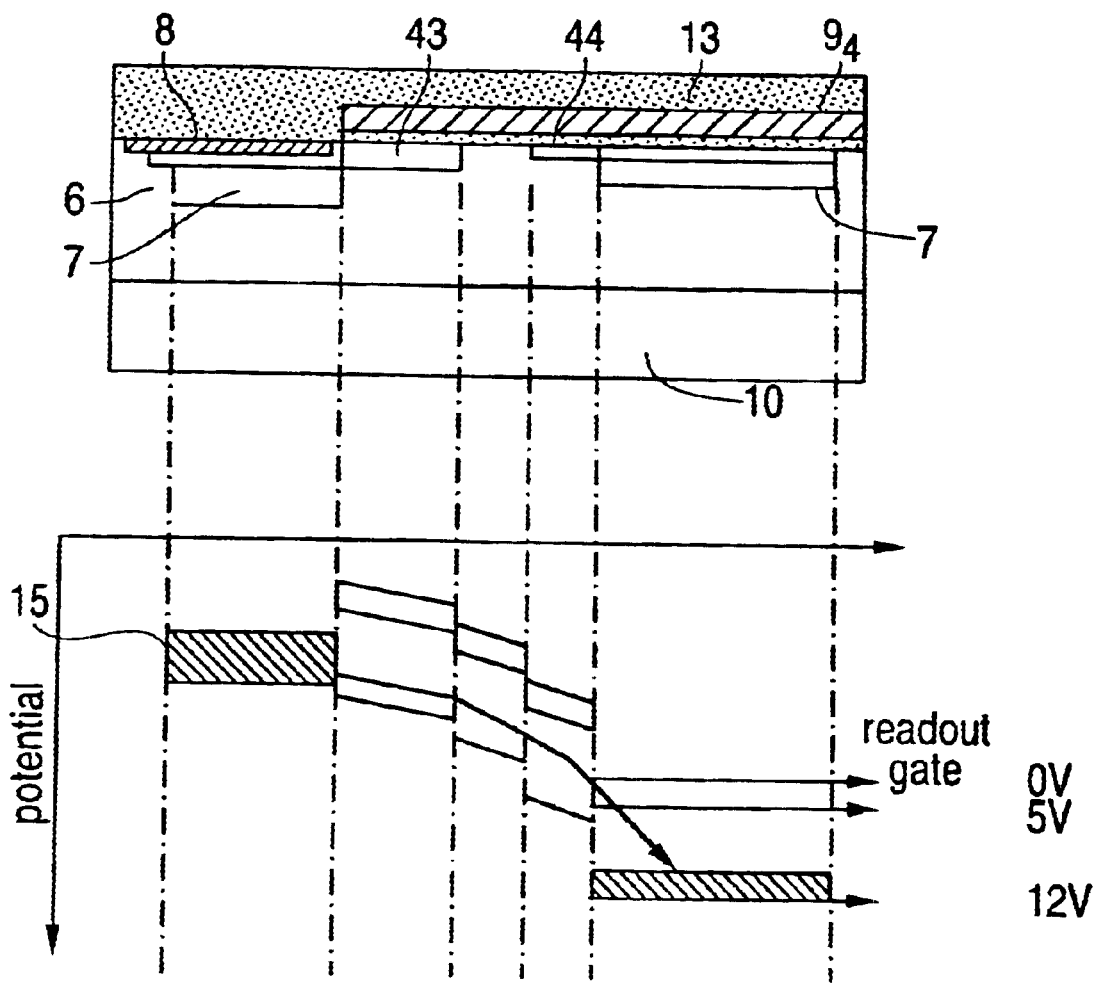
FIG. 20 is a sectional view taken along line N–N' of the charge transfer device of FIG. 19 and a potential distribution diagram.
Figure 21:
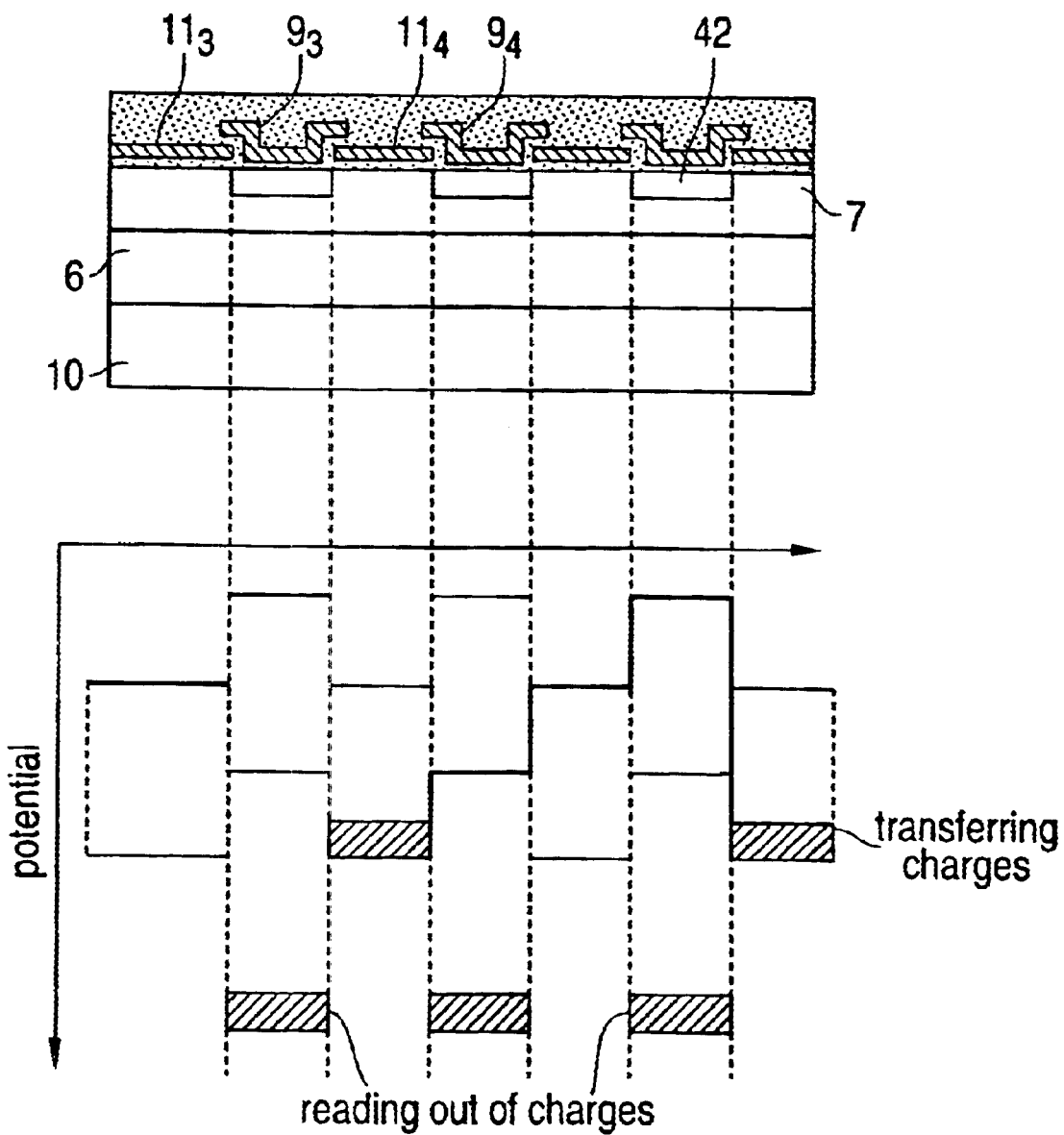
FIG. 21 is a sectional view taken along line O–O' of the charge transfer device of FIG. 18 and a potential distribution diagram.

FIG. 18 is a plan view of a charge transfer device according to a fifth embodiment of the present invention; FIG. 19 is an enlarged view of a substrate at portion M in FIG. 18; FIG. 20 is a sectional view taken along line N–N' of FIG. 19 and a potential distribution diagram; and FIG. 21 is a sectional view taken along line O–O' of FIG. 18 and a potential distribution diagram.

The one line distance charge transfer device according to the present embodiment employs a method (hereinafter referred to as 1 poly-storage) wherein charge is accumulated at a polysilicon gate portion of a first layer at a CCD portion, and in the one line distance charge transfer device, ion implantation is performed in order for N-type well 10, readout channel control P-type implantation region and CCD barrier portion P-type implantation region 43, and CCD barrier portion P-type implantation region 44.

The ion concentration into readout channel control P-type implantation region and CCD barrier portion P-type implantation region 43 must be set so that, when a voltage of 5 V is applied to the readout gate, the readout gate may be off, but when another voltage of 12 V is applied, the readout gate may be on. Into CCD barrier portion P-type implantation region 44, ions are implanted such an amount that CCD barrier portion P-type implantation region 44 exhibits a voltage of approximately 3.5 V when the voltage at the N well implantation region of CCD 24 is approximately 6.0 V.

FIG. 20 shows potentials when 0 V, 5 V and 12 V are applied to the readout gate. Three stages of potential are present between pixel 1 and CCD 24, and the potential difference between them acts effectively upon electrons to allow high rate readout from pixel 1 to CCD 24. FIG. 21 is a sectional view of the CCD part of the 1 poly-storage and a potential distribution diagram.

In particular, in the fourth embodiment described above, a polysilicon gate of a first layer is used as a mask to selectively implant an N-type semiconductor substance (such as phosphor) such that a polysilicon gate portion of a second layer has a relatively higher potential than that of the polysilicon gate portion of the first layer so that, when charge is transferred, the charge is accumulated in the polysilicon gate portion of the second layer.

Consequently, the implantation of an N-type semiconductor substance can be performed also for a channel portion which is used to read out charge from pixel 1 at the center thereby to allow charge to be read out smoothly from pixel 1 at the center.

In contrast, in the fifth embodiment, a polysilicon gate of a first layer is used as a mask to selectively implant a P-type semiconductor substance (such as boron) such that a polysilicon gate portion of a second layer has a relatively lower potential than that of the polysilicon gate portion of the first layer so that, when charge is transferred, the charge is accumulated in the polysilicon gate portion of the first layer.

Consequently, the implantation of a P-type semiconductor substance can be performed also for a channel portion which is used to read out charge from pixel 1 at the center thereby to allow charge to be read out smoothly from pixel 1 at the center.

Further, as seen in FIGS. 15 and 19, N-type well 10 used for CCD 24 is formed by implantation into part of readout channel 40, which is used to read out charge, such that it projects like a bar.

It is to be noted that, in a charge transfer device of the one line distance type, an increase of the width of a readout channel to be used for reading out from the central pixel decreases the area of a photodiode disposed on the outer side, and this decreases the sensitivity. A decrease of the width of the channel requires an increased time for charge to pass through the channel, and a longer time is required to read out charge from the central pixel than to read out charge from the other two pixels. It is known that also the amount of charge remaining in the channel (residual image) increases and this deteriorates the remaining image characteristic.

The charge transfer devices of the fourth and fifth embodiments described above effectively function to improve the performance in this regard.

While preferred embodiments of the present invention have been described using specific terms, such description is for illustrative purposes only, and it is to be understood that changes and variations may be made without departing from the spirit or scope of the following claims.

What is claimed is:

1. A charge transfer device, comprising:
   first pixel row composed of a plurality of pixels;
   a second pixel row composed of a plurality of pixels and arranged adjacently to said first pixel row;
   a third pixel row composed of a plurality of pixels and arranged adjacently to said second pixel row on the opposite side from said first pixel row, corresponding pixels of the first, second and third rows being arranged in lines;
   a first charge coupled element including a plurality of first readout electrodes, each corresponding to a respective pixel of the first pixel row, for reading out signal charges generated in corresponding pixels of said first pixel row, and a plurality of first transfer electrodes for transferring the signal charges read out by said first readout electrodes; and
   a second charge coupled element including a plurality of second readout electrodes, each corresponding to a respective pixel of the second pixel row, each located between adjacent pixels of said third pixel row, for reading out signal charges generated in corresponding pixels of said second pixel row, a plurality of third readout electrodes, each corresponding to a respective pixel of the third pixel row, for reading out signal charges generated in corresponding pixels of said third pixel row, and a plurality of second transfer electrodes for transferring the signal charges read out by said second and third readout electrodes,
   wherein a readout channel of each of said second readout electrodes is dimensioned such that the width is greater at portion adjacent to said second charge coupled element row than at the portion adjacent to said second pixel row.

2. A charge transfer device as claimed in claim 1, wherein the distance between said first pixel row and said second pixel row and the distance between said second pixel row and said third pixel row are substantially equal to the length of one pixel of said first, second and third pixel rows.

3. A charge transfer device as claimed in claim 1, wherein the pitch of the electrodes of said second charge coupled element is equal to substantially one half the pitch of the electrodes of said first charge coupled element, and said second charge coupled element further includes electrodes placed between said second readout electrodes and said third readout electrodes for temporarily holding signal charges therein.

4. A charge transfer device as claimed in claim 3, wherein the distance between said first pixel row and said second pixel row and the distance between said second pixel row and said third pixel row are substantially equal to the length of one pixel of said first, second and third pixel rows.

5. A charge transfer device as claimed in claim 1, wherein ions are implanted into portions of readout channels beneath said second readout electrodes to form a potential difference between pixels of the second pixel row and charge accumulation portions beneath said second readout electrodes.

6. A charge transfer device as claimed in claim 5, wherein said implanted ions make the potential of a charge accumulation portion beneath the second readout electrodes relatively higher than the potential of pixels of the second pixel row such that, when charge is transferred, the charge is accumulated at the charge accumulation portions beneath the second readout electrodes.

7. A charge transfer device as claimed in claim 6, wherein an N-type semiconductor substance is selectively implanted into the charge accumulation portions beneath the second readout electrodes.

8. A charge transfer device as claimed in claim 5, wherein said implanted ions make the potential of a charge accumulation portion beneath the second readout electrodes relatively lower than the potential of pixels of the second pixel row such that, when charge is transferred, the charge is accumulated at the charge accumulation portions beneath the second readout electrodes.

9. A charge transfer device as claimed in claim 8, wherein a P-type semiconductor substance is selectively implanted into the charge accumulation portions beneath the second readout electrodes.

10. A charge transfer device as claimed in claim 5, wherein an N-type well which is used for a charge coupled element is formed by implantation into a part of a readout channel to be used to read out charge.

* * * * *